United States Patent
Wang et al.

(10) Patent No.: US 12,019,905 B2
(45) Date of Patent: Jun. 25, 2024

(54) DIGITAL COMPUTE IN MEMORY

(71) Applicant: QUALCOMM Incorporated, San Diego, CA (US)

(72) Inventors: Zhongze Wang, San Diego, CA (US); Mustafa Badaroglu, Flemish Brabant (BE)

(73) Assignee: QUALCOMM Incorporated, San Diego, CA (US)

( * ) Notice: Subject to any disclaimer, the term of this patent is extended or adjusted under 35 U.S.C. 154(b) by 82 days.

(21) Appl. No.: 17/816,285

(22) Filed: Jul. 29, 2022

(65) Prior Publication Data

US 2023/0037054 A1  Feb. 2, 2023

Related U.S. Application Data

(60) Provisional application No. 63/228,523, filed on Aug. 2, 2021.

(51) Int. Cl.
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC .... G06F 3/0604; G06F 3/0655; G06F 3/0679; G06N 3/065
USPC .......................................................... 711/154
See application file for complete search history.

(56) References Cited

U.S. PATENT DOCUMENTS

| | | | |
|---|---|---|---|
| 10,831,446 B2 | 11/2020 | Chen et al. | |
| 2016/0049195 A1 | 2/2016 | Yu et al. | |
| 2016/0350617 A1* | 12/2016 | Willcock | G11C 11/4096 |
| 2019/0042160 A1* | 2/2019 | Kumar | G06F 3/0659 |
| 2019/0102170 A1* | 4/2019 | Chen | G11C 7/16 |
| 2019/0205358 A1* | 7/2019 | Diril | G06N 3/063 |
| 2020/0065658 A1 | 2/2020 | Akopyan et al. | |
| 2020/0233923 A1 | 7/2020 | Knag et al. | |
| 2020/0357459 A1* | 11/2020 | Zidan | G11C 7/1006 |
| 2021/0043253 A1 | 2/2021 | Chen et al. | |
| 2021/0166110 A1 | 6/2021 | Song | |
| 2022/0100601 A1* | 3/2022 | Baum | G06F 11/1608 |

(Continued)

FOREIGN PATENT DOCUMENTS

EP  3671748 A1  6/2020

OTHER PUBLICATIONS

International Search Report and Written Opinion—PCT/US2022/074399—ISA/EPO—Nov. 21, 2022.

(Continued)

*Primary Examiner* — Hashem Farrokh
(74) *Attorney, Agent, or Firm* — QUALCOMM Incorporated

(57) ABSTRACT

Certain aspects generally relate to performing machine learning tasks, and in particular, to computation-in-memory architectures and operations. One aspect provides a circuit for in-memory computation. The circuit generally includes multiple bit-lines, multiple word-lines, an array of compute-in-memory cells, and a plurality of accumulators, each accumulator being coupled to a respective one of the multiple bit-lines. Each compute-in-memory cell is coupled to one of the bit-lines and to one of the word-lines and is configured to store a weight bit of a neural network.

23 Claims, 8 Drawing Sheets

(56) References Cited

U.S. PATENT DOCUMENTS

2022/0244916 A1\* 8/2022 Lee ...................... G11C 11/419

OTHER PUBLICATIONS

Jhang C-J., et al., "Challenges and Trends of SRAM-Based Computing-In-Memory for AI Edge Devices," IEEE Transactions on Circuits and Systems I: Regular Papers, IEEE, US, vol. 68, No. 5, Mar. 22, 2021, pp. 1773-1786, XP011850843, ISSN: 1549-8328, DOI: 10.1109/TCSI.2021.3064189 [retrieved on Apr. 19, 2021].

\* cited by examiner

DIGITAL COMPUTE IN MEMORY

CROSS-REFERENCE TO RELATED APPLICATION

This application claims benefit of and priority to U.S. Provisional Application No. 63/228,523 filed Aug. 2, 2021, which is hereby expressly incorporated by reference herein in its entirety as if fully set forth below and for all applicable purposes.

INTRODUCTION

Aspects of the present disclosure relate to performing machine learning tasks, and in particular, to computation-in-memory architectures.

Machine learning is generally the process of producing a trained model (e.g., an artificial neural network, a tree, or other structures), which represents a generalized fit to a set of training data that is known a priori. Applying the trained model to new data produces inferences, which may be used to gain insights into the new data. In some cases, applying the model to the new data is described as "running an inference" on the new data.

As the use of machine learning has proliferated for enabling various machine learning (or artificial intelligence) tasks, the need for more efficient processing of machine learning model data has arisen. In some cases, dedicated hardware, such as machine learning accelerators, may be used to enhance a processing system's capacity to process machine learning model data. However, such hardware demands space and power, which is not always available on the processing device. For example, "edge processing" devices, such as mobile devices, always-on devices, Internet of Things (IoT) devices, and the like, typically have to balance processing capabilities with power and packaging constraints. Further, accelerators may move data across common data busses, which can cause significant power usage and introduce latency into other processes sharing the data bus. Consequently, other aspects of a processing system are being considered for processing machine learning model data.

Memory devices are one example of another aspect of a processing system that may be leveraged for performing processing of machine learning model data through so-called computation-in-memory (CIM) processes. CIM arrays were developed to implement a node of a neural network framework without data transfer bottlenecks. A data transfer bottleneck is avoided by storing weight data within each cell of a CIM array and also performing a multiply operation within each cell. Neural networks are a form of artificial intelligence relied on for a high level of accuracy, so the CIM array may be expected to generate accurate results. Conventional CIM processes perform computation using analog signals, which may be more susceptible to inaccuracy in computation results, adversely impacting neural network computations. Accordingly, systems and methods are needed for performing computation-in-memory with increased accuracy. Additional design goals for CIM may include flexibility and scalability.

BRIEF SUMMARY

Certain aspects provide apparatus and techniques for performing machine learning tasks, and in particular, computation-in-memory architectures.

One aspect provides a circuit for in-memory computation. The circuit generally includes a plurality of memory cells on each of multiple bit-lines of a memory, the plurality of memory cells being configured to store multiple bits representing weights of a neural network. The plurality of memory cells on each of the multiple bit-lines may be on different word-lines of the memory. The circuit also includes a plurality of accumulators, each accumulator being coupled to a respective one of the multiple bit-lines.

Another aspect provides a method for in-memory computation. The method generally includes: storing, in a plurality of memory cells on each of multiple bit-lines of a memory, multiple bits representing weights of a neural network, wherein the plurality of memory cells on each of the multiple bit-lines are on different word-lines of the memory; and accumulating, via each accumulator of a plurality of accumulators, output signals of two or more of the plurality of memory cells on a respective one of the multiple bit-lines after two or more of the word-lines are sequentially activated.

Yet another aspect provides an apparatus for in-memory computation. The apparatus generally includes: means for storing, in a plurality of memory cells on each of multiple bit-lines of the means for storing, multiple bits representing weights of a neural network, wherein the plurality of memory cells on each of the multiple bit-lines are on different word-lines of the means for storing; and means for accumulating output signals of two or more of the plurality of memory cells on a respective one of the multiple bit-lines after two or more of the word-lines are sequentially activated.

Yet another aspect provides a circuit for in-memory computation. The circuit generally includes multiple bit-lines; multiple word-lines; an array of compute-in-memory cells, wherein each compute-in-memory cell is coupled to one of the bit-lines and to one of the word-lines and is configured to store a weight bit of a neural network; and a plurality of accumulators, each accumulator being coupled to a respective one of the multiple bit-lines.

Yet another aspect provides a method for in-memory computation. The method generally includes: performing computations, in at least a portion of an array of compute-in-memory cells, on a weight and an activation input for a neural network, each compute-in-memory cell being coupled to one of multiple bit-lines and to one of multiple word-lines and being configured to store a bit of the weight for the neural network; and accumulating, via each accumulator of a plurality of accumulators, output signals from two or more of the compute-in-memory cells coupled to a respective one of the multiple bit-lines.

Other aspects provide processing systems configured to perform the aforementioned methods as well as those described herein; non-transitory, computer-readable media comprising instructions that, when executed by one or more processors of a processing system, cause the processing system to perform the aforementioned methods as well as those described herein; a computer program product embodied on a computer-readable storage medium comprising code for performing the aforementioned methods as well as those further described herein; and a processing system comprising means for performing the aforementioned methods as well as those further described herein.

The following description and the related drawings set forth in detail certain illustrative features of one or more aspects.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the drawings. It is contemplated that elements and features of one aspect may be beneficially incorporated in other aspects without further recitation.

DETAILED DESCRIPTION

Figure 1A:
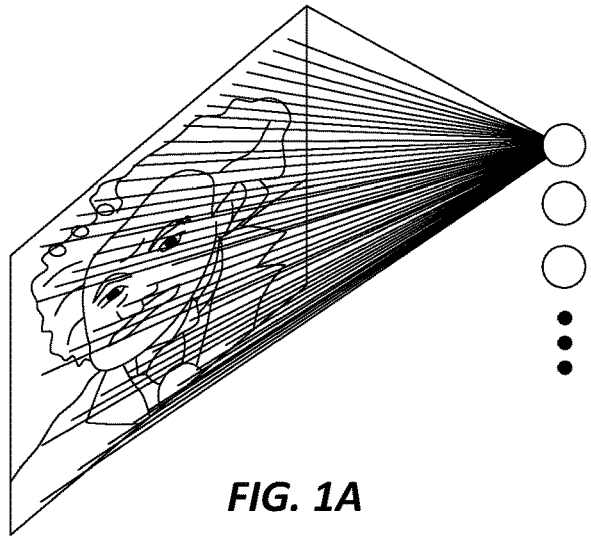
FIGS. 1A-1D depict examples of various types of neural networks, which may be implemented by aspects of the present disclosure.

Aspects of the present disclosure provide apparatus, methods, processing systems, and computer-readable mediums for performing computation in memory (CIM) to handle data-intensive processing, such as implementing machine learning models. Some aspects provide techniques for performing digital CIM using accumulators, each accumulator accumulating output signals on a respective one of multiple bit-lines of memory after multiple activation cycles. In some aspects, during each of the multiple activation cycles, one of the word-lines may be activated. In other words, the word-lines may be sequentially activated, and the accumulators may concurrently perform accumulation to provide an accumulation result after two or more of the word-lines are sequentially activated.

CIM-based machine learning (ML)/artificial intelligence (AI) may be used for a wide variety of tasks, including image processing (e.g., still images and video), audio processing, controlling radio frequency (RF) front-ends in wireless communications, and making wireless communication decisions (e.g., to optimize, or at least increase, throughput and signal quality). Further, CIM may be based on various types of memory architectures, such as dynamic random-access memory (DRAM), static random-access memory (SRAM) (e.g., based on an SRAM cell as in FIG. 4), magnetoresistive random-access memory (MRAM), and resistive random-access memory (ReRAM or RRAM), and may be attached to various types of processing units, including central processing units (CPUs), digital signal processors (DSPs), graphics processing units (GPUs), field-programmable gate arrays (FPGAs), neural processing units (NPUs), neural signal processors (NSPs), and others. Generally, CIM may beneficially reduce the "memory wall" problem, which is where the movement of data in and out of memory consumes more power than the computation of the data. Thus, by performing the computation in memory, significant power savings may be realized. This is particularly useful for various types of electronic devices, such as low power edge devices, mobile devices, and the like.

For example, a mobile device may include a memory device configured for storing data and performing compute-in-memory operations. The mobile device may be configured to perform an ML/AI operation based on data generated by the mobile device, such as image data generated by a camera sensor of the mobile device, audio data received via a microphone of the mobile device, inertial data gathered by an accelerometer or gyroscope of the mobile device, temperature data captured by a temperature sensor of the mobile device, etc., and/or combinations thereof. A memory controller unit (MCU) of the mobile device may thus load weights from another on-board memory (e.g., flash or RAM) into a CIM array of the memory device and allocate input feature buffers and output (e.g., output activation) buffers. The processing device may then commence processing of the data by loading, for example, a layer in the input buffer and processing the layer with weights loaded into the CIM array. This processing may be repeated for each layer of the data, and the outputs (e.g., output activations) may be stored in the output buffers and then used by the mobile device for an ML/AI task, such as intelligently controlling wireless communications, a heating and air conditioning system, a security system, or other Internet of Things (IoT) applications.

Brief Background on Neural Networks, Deep Neural Networks, and Deep Learning

Neural networks are organized into layers of interconnected nodes. Generally, a node (or neuron) is where computation happens. For example, a node may combine input data with a set of weights (or coefficients) that either amplifies or dampens the input data. The amplification or dampening of the input signals may thus be considered an assignment of relative significances to various inputs with regard to a task the network is trying to learn. Generally, input-weight products are summed (or accumulated), and then the sum is passed through a node's activation function to determine whether and to what extent that signal should progress further through the network.

In a most basic implementation, a neural network may have an input layer, a hidden layer, and an output layer. "Deep" neural networks generally have more than one hidden layer.

Deep learning is a method of training deep neural networks. Generally, deep learning maps inputs to the network to outputs from the network and is thus sometimes referred to as a "universal approximator" because deep learning can learn to approximate an unknown function $f(x)=y$ between any input x and any output y. In other words, deep learning finds the right $f$ to transform x into y.

More particularly, deep learning trains each layer of nodes based on a distinct set of features, which is the output from the previous layer. Thus, with each successive layer of a deep neural network, features become more complex. Deep learning is thus powerful because it can progressively extract higher level features from input data and perform complex tasks, such as object recognition, by learning to represent inputs at successively higher levels of abstraction in each layer, thereby building up a useful feature representation of the input data.

For example, if presented with visual data, a first layer of a deep neural network may learn to recognize relatively simple features, such as edges, in the input data. In another example, if presented with auditory data, the first layer of a deep neural network may learn to recognize spectral power in specific frequencies in the input data. The second layer of the deep neural network may then learn to recognize combinations of features, such as simple shapes for visual data or combinations of sounds for auditory data, based on the output of the first layer. Higher layers may then learn to recognize complex shapes in visual data or words in auditory data. Still higher layers may learn to recognize common visual objects or spoken phrases. Thus, deep learning architectures may perform especially well when applied to problems that have a natural hierarchical structure.

Layer Connectivity in Neural Networks

Neural networks, such as deep neural networks (DNNs), may be designed with a variety of connectivity patterns between layers.

FIG. 1A illustrates an example of a fully connected neural network 102. In a fully connected neural network 102, each node in a first layer communicates its output to every node in a second layer, so that each node in the second layer will receive input from every node in the first layer.

Figure 1B:
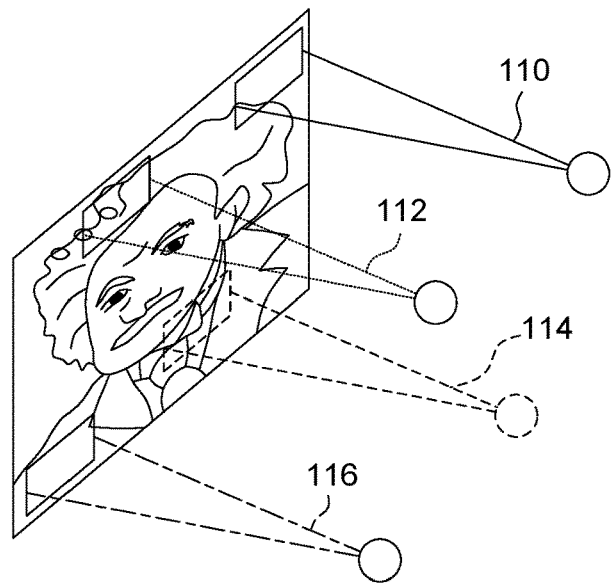

FIG. 1B illustrates an example of a locally connected neural network 104. In a locally connected neural network 104, a node in a first layer may be connected to a limited number of nodes in the second layer. More generally, a locally connected layer of the locally connected neural network 104 may be configured so that each node in a layer will have the same or a similar connectivity pattern, but with connection strengths (or weights) that may have different values (e.g., values associated with local areas 110, 112, 114, and 116 of the first layer nodes). The locally connected connectivity pattern may give rise to spatially distinct receptive fields in a higher layer, because the higher layer nodes in a given region may receive inputs that are tuned through training to the properties of a restricted portion of the total input to the network.

Figure 1C:
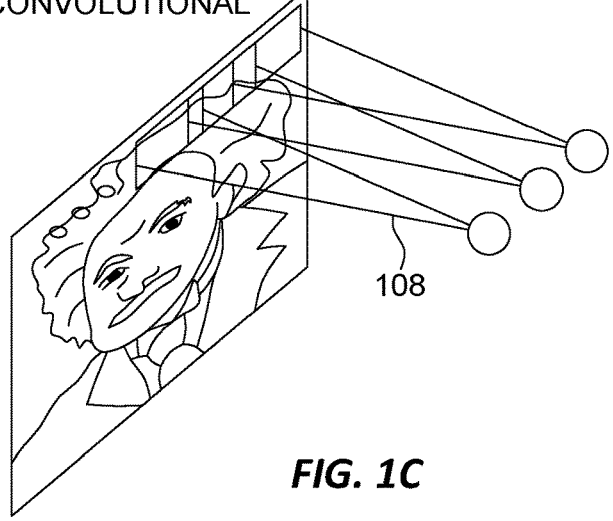

One type of locally connected neural network is a convolutional neural network (CNN). FIG. 1C illustrates an example of a convolutional neural network 106. The convolutional neural network 106 may be configured such that the connection strengths associated with the inputs for each node in the second layer are shared (e.g., for local area 108 overlapping another local area of the first layer nodes). Convolutional neural networks are well suited to problems in which the spatial locations of inputs are meaningful.

One type of convolutional neural network is a deep convolutional network (DCN). Deep convolutional networks are networks of multiple convolutional layers, which may further be configured with, for example, pooling and normalization layers.

Figure 1D:
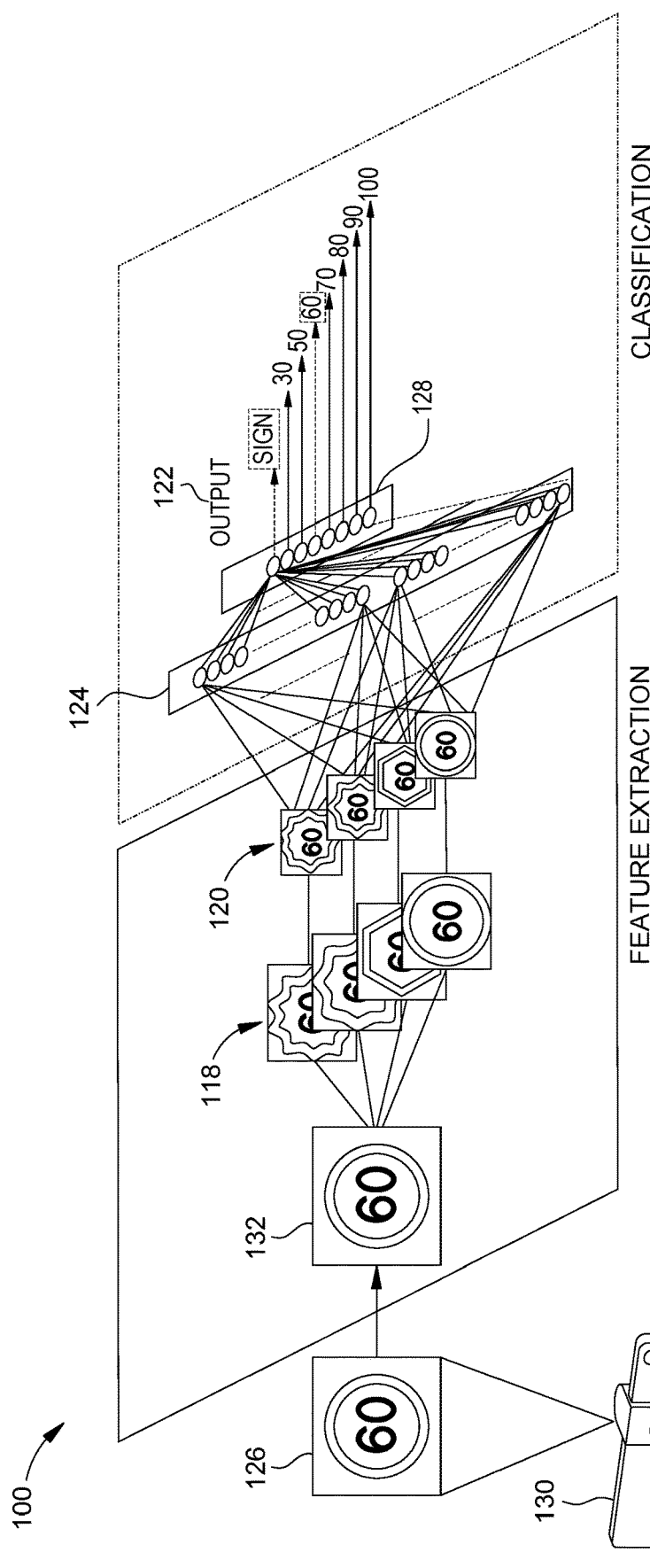

FIG. 1D illustrates an example of a DCN 100 designed to recognize visual features in an image 126 generated by an image-capturing device 130. For example, if the image-capturing device 130 is a camera mounted in or on (or otherwise moving along with) a vehicle, then the DCN 100 may be trained with various supervised learning techniques to identify a traffic sign and even a number on the traffic sign. The DCN 100 may likewise be trained for other tasks, such as identifying lane markings or identifying traffic lights. These are just some example tasks, and many others are possible.

In the example of FIG. 1D, the DCN 100 includes a feature-extraction section and a classification section. Upon receiving the image 126, a convolutional layer 132 applies convolutional kernels (for example, as depicted and described in FIG. 2) to the image 126 to generate a first set of feature maps 118 (or intermediate activations). Generally, a "kernel" or "filter" comprises a multidimensional array of weights designed to emphasize different aspects of an input data channel. In various examples, "kernel" and "filter" may be used interchangeably to refer to sets of weights applied in a convolutional neural network.

The first set of feature maps 118 may then be subsampled by a pooling layer (e.g., a max pooling layer, not shown) to generate a second set of feature maps 120. The pooling layer may reduce the size of the first set of feature maps 118 while maintaining much of the information in order to improve model performance. For example, the second set of feature maps 120 may be downsampled to a 14×14 matrix from a 28×28 matrix by the pooling layer.

This process may be repeated through many layers. In other words, the second set of feature maps 120 may be further convolved via one or more subsequent convolutional layers (not shown) to generate one or more subsequent sets of feature maps (not shown).

In the example of FIG. 1D, the second set of feature maps 120 is provided to a fully connected layer 124, which in turn generates an output feature vector 128. Each feature of the output feature vector 128 may include a number that corresponds to a possible feature of the image 126, such as "sign," "60," and "100." In some cases, a softmax function (not shown) may convert the numbers in the output feature vector 128 to a probability. In such cases, an output 122 of the DCN 100 is a probability of the image 126 including one or more features.

A softmax function (not shown) may convert the individual elements of the output feature vector 128 into a probability in order that an output 122 of DCN 100 is one or more probabilities of the image 126 including one or more features, such as a sign with the number "60" thereon, as in image 126. Thus, in the present example, the probabilities in the output 122 for "sign" and "60" should be higher than the probabilities of the other elements of the output 122, such as "30," "40," "50," "70," "80," "90," and "100."

Before training the DCN 100, the output 122 produced by the DCN 100 may be incorrect. Thus, an error may be calculated between the output 122 and a target output known a priori. For example, here the target output is an indication that the image 126 includes a "sign" and the number "60." Utilizing the known target output, the weights of the DCN 100 may then be adjusted through training so that a subsequent output 122 of the DCN 100 achieves the target output (with high probabilities).

To adjust the weights of the DCN 100, a learning algorithm may compute a gradient vector for the weights. The gradient vector may indicate an amount that an error would increase or decrease if a weight were adjusted in a particular way. The weights may then be adjusted to reduce the error. This manner of adjusting the weights may be referred to as "backpropagation" because this adjustment process involves a "backward pass" through the layers of the DCN 100.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level.

After training, the DCN 100 may be presented with new images, and the DCN 100 may generate inferences, such as classifications, or probabilities of various features being in the new image.

Convolution Techniques for Convolutional Neural Networks

Convolution is generally used to extract useful features from an input data set. For example, in convolutional neural networks, such as described above, convolution enables the extraction of different features using kernels and/or filters whose weights are automatically learned during training. The extracted features are then combined to make inferences.

An activation function may be applied before and/or after each layer of a convolutional neural network. Activation functions are generally mathematical functions that determine the output of a node of a neural network. Thus, the activation function determines whether a node should pass information or not, based on whether the node's input is relevant to the model's prediction. In one example, where y=conv(x) (i.e., y is the convolution of x), both x and y may be generally considered as "activations." However, in terms of a particular convolution operation, x may also be referred to as "pre-activations" or "input activations" as x exists before the particular convolution, and y may be referred to as output activations or a feature map.

Figure 2:
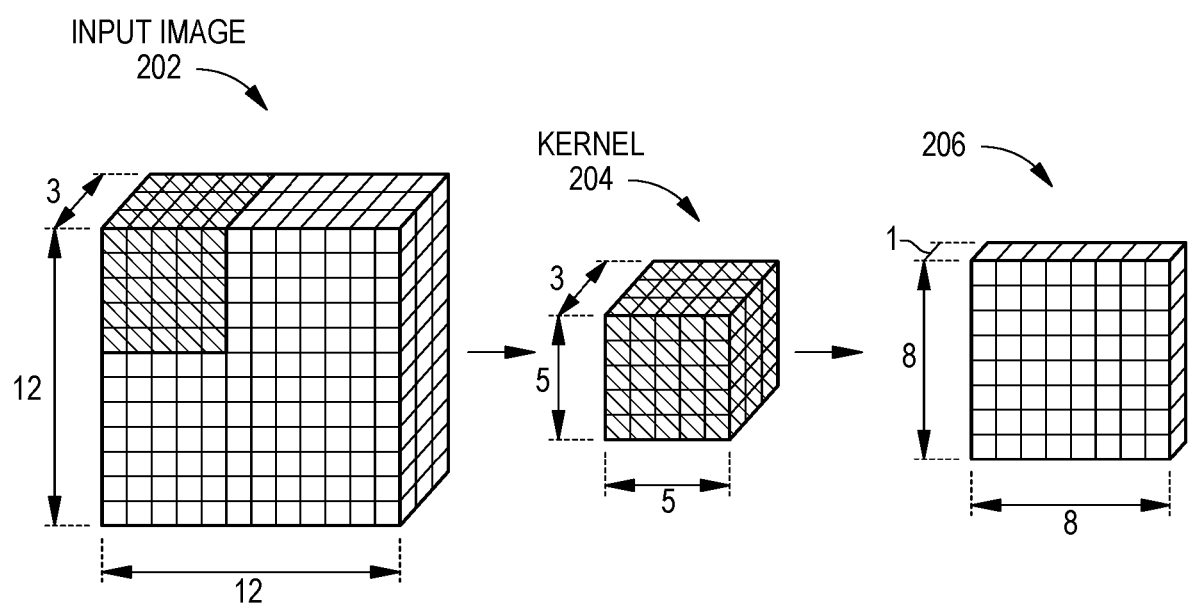
FIG. 2 depicts an example of a traditional convolution operation, which may be implemented by aspects of the present disclosure.

FIG. 2 depicts an example of a traditional convolution in which a 12-pixel×12-pixel×3-channel input image is convolved using a 5×5×3 convolution kernel 204 and a stride (or step size) of 1. The resulting feature map 206 is 8 pixels×8 pixels×1 channel. As seen in this example, the traditional convolution may change the dimensionality of the input data as compared to the output data (here, from 12×12 to 8×8 pixels), including the channel dimensionality (here, from 3 channels to 1 channel).

Figure 3A:
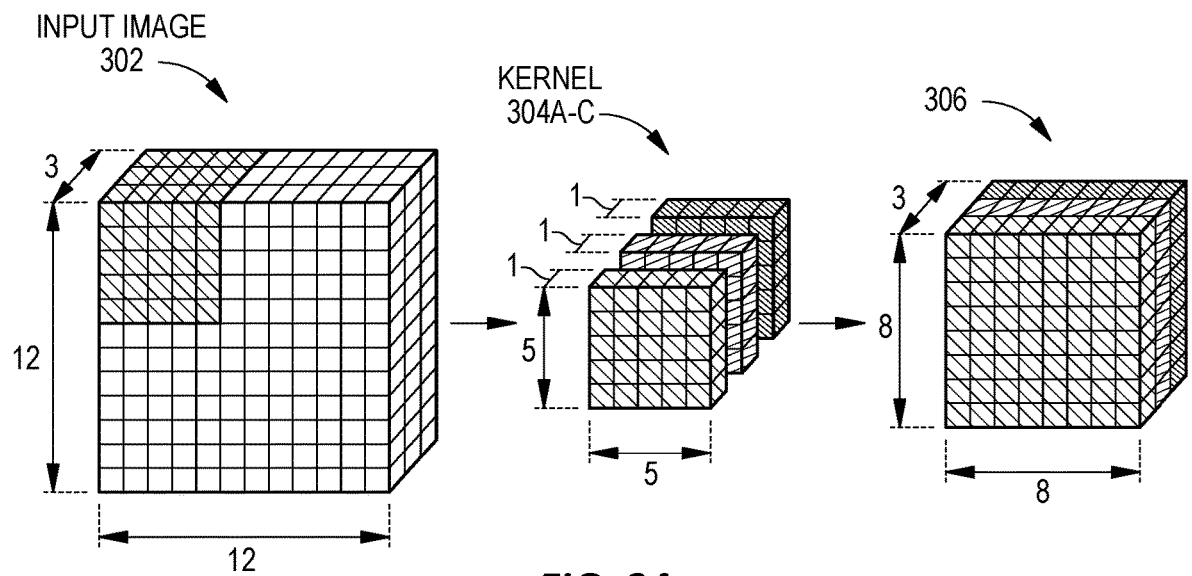
FIGS. 3A and 3B depict examples of depthwise separable convolution operations, which may be implemented by aspects of the present disclosure.
Figure 3B:
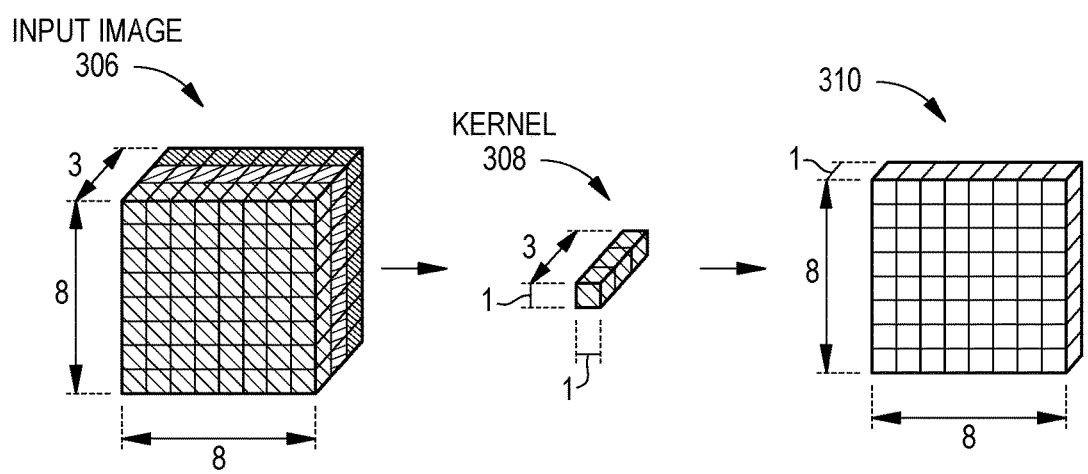

One way to reduce the computational burden (e.g., measured in floating-point operations per second (FLOPs)) and the number of parameters associated with a neural network comprising convolutional layers is to factorize the convolutional layers. For example, a spatial separable convolution, such as depicted in FIG. 2, may be factorized into two components: (1) a depthwise convolution, where each spatial channel is convolved independently by a depthwise convolution (e.g., a spatial fusion); and (2) a pointwise convolution, where all the spatial channels are linearly combined (e.g., a channel fusion). An example of a depthwise separable convolution is depicted in FIGS. 3A and 3B. Generally, during spatial fusion, a network learns features from the spatial planes, and during channel fusion, the network learns relations between these features across channels.

In one example, a depthwise separable convolution may be implemented using 5×5 kernels for spatial fusion, and 1×1 kernels for channel fusion. In particular, the channel fusion may use a 1×1×d kernel that iterates through every single point in an input image of depth d, where the depth d of the kernel generally matches the number of channels of the input image. Channel fusion via pointwise convolution is useful for dimensionality reduction for efficient computations. Applying 1×1×d kernels and adding an activation layer after the kernel may give a network added depth, which may increase the network's performance.

In particular, in FIG. 3A, the 12-pixel×12-pixel×3-channel input image 302 is convolved with a filter comprising three separate kernels 304A-C, each having a 5×5×1 dimensionality, to generate a feature map 306 of 8 pixels×8 pixels×3 channels, where each channel is generated by an individual kernel among kernels 304A-C.

Then, feature map 306 is further convolved using a pointwise convolution operation with a kernel 308 having dimensionality 1×1×3 to generate a feature map 310 of 8 pixels×8 pixels×1 channel. As is depicted in this example, feature map 310 has reduced dimensionality (1 channel versus 3 channels), which allows for more efficient computations therewith.

Though the result of the depthwise separable convolution in FIGS. 3A and 3B is substantially similar to the traditional convolution in FIG. 2, the number of computations is significantly reduced, and thus depthwise separable convolution offers a significant efficiency gain where a network design allows it.

Though not depicted in FIG. 3B, multiple (e.g., m) pointwise convolution kernels 308 (e.g., individual components of a filter) can be used to increase the channel dimensionality of the convolution output. So, for example, m=256 1×1×3 kernels 308 can be generated, in which each output is an 8-pixel×8-pixel×1-channel feature map (e.g., feature map 310), and these feature maps can be stacked to get a resulting feature map of 8 pixels×8 pixels×256 channels. The resulting increase in channel dimensionality provides more parameters for training, which may improve a convolutional neural network's ability to identify features (e.g., in input image 302).

Example Compute-in-Memory (CIM) Architecture

Figure 4:
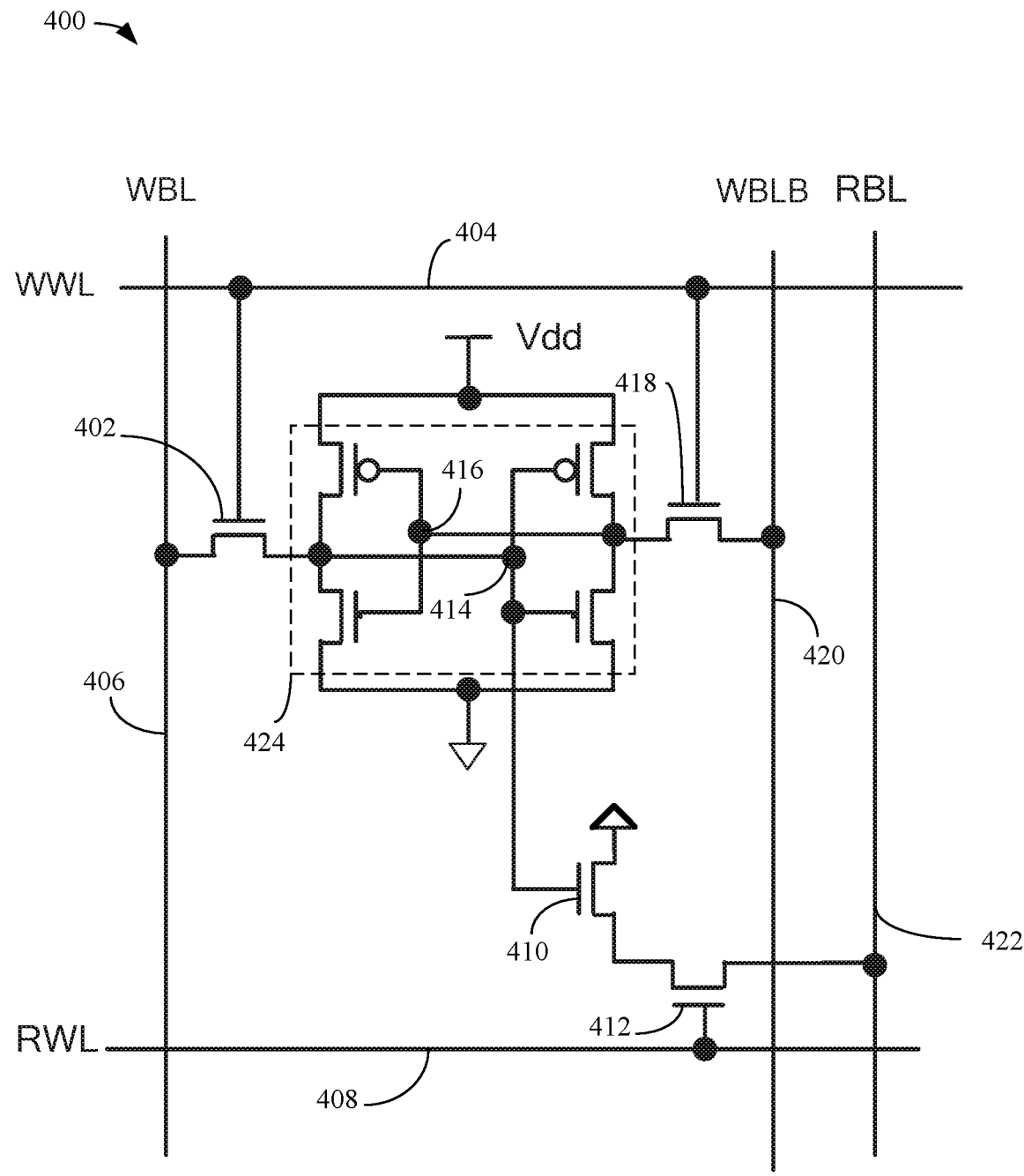
FIG. 4 illustrates an example memory cell implemented as an eight-transistor (8T) static random access memory (SRAM) cell for a compute-in-memory (CIM) circuit.

FIG. 4 illustrates an example memory cell 400 of a static random access memory (SRAM), which may be implemented in a CIM array. The memory cell 400 may be referred to as an 8-transistor (8T) SRAM cell as the memory cell 400 is implemented with eight transistors.

As shown, the memory cell 400 may include a flip-flop, which may be implemented as a cross-coupled invertor pair 424 having an output 414 and an output 416. As shown, the cross-coupled invertor pair output 414 is selectively coupled to a write bit-line (WBL) 406 via a pass-gate transistor 402, and the cross-coupled invertor pair output 416 is selectively coupled to a complementary write bit-line (WBLB) 420 via a pass-gate transistor 418. The WBL 406 and WBLB 420 are configured to provide complementary digital signals to be written (e.g., stored) in the cross-coupled invertor pair 424. The WBL and WBLB may be used to store a bit for a neural network weight in the memory cell 400. The gates of pass-gate transistors 402, 418 may be coupled to a write word-line (WWL) 404, as shown. For example, a digital signal to be written may be provided to the WBL (and a complement of the digital signal is provided to the WBLB). The pass-gate transistors 402, 418—which are implemented here as n-type field-effect transistors (NFETs)—are then turned on by providing a logic high signal to WWL 404, resulting in the digital signal being stored in the cross-coupled invertor pair 424.

As shown, the cross-coupled invertor pair output 414 may be coupled to a gate of a transistor 410. The source of the transistor 410 may be coupled to a reference potential node (VSS or electrical ground), and the drain of the transistor 410 may be coupled to a source of a transistor 412. The drain of the transistor 412 may be coupled to a read bit-line (RBL) 422, as shown. The gate of transistor 412 may be controlled via a read word-line (RWL) 408. The RWL 408 may be controlled via an activation input signal.

During a read cycle, the RBL 422 may be precharged to logic high. If both the activation input and the weight bit stored at the cross-coupled invertor pair output 414 are logic high, then transistors 410, 412 are both turned on, electrically coupling the RBL 422 to VSS at the source of transistor 410 and discharging the RBL 422 to logic low. If either the activation input or the weight stored at the cross-coupled invertor pair output 414 is logic low, then at least one of transistors 410, 412 will be turned off, such that the RBL 422 remains logic high. Thus, the output of the memory cell 400 at RBL 422 is logic low only when both the weight bit and activation input are logic high, and is logic high otherwise, effectively implementing a NAND-gate operation.

Figure 5:
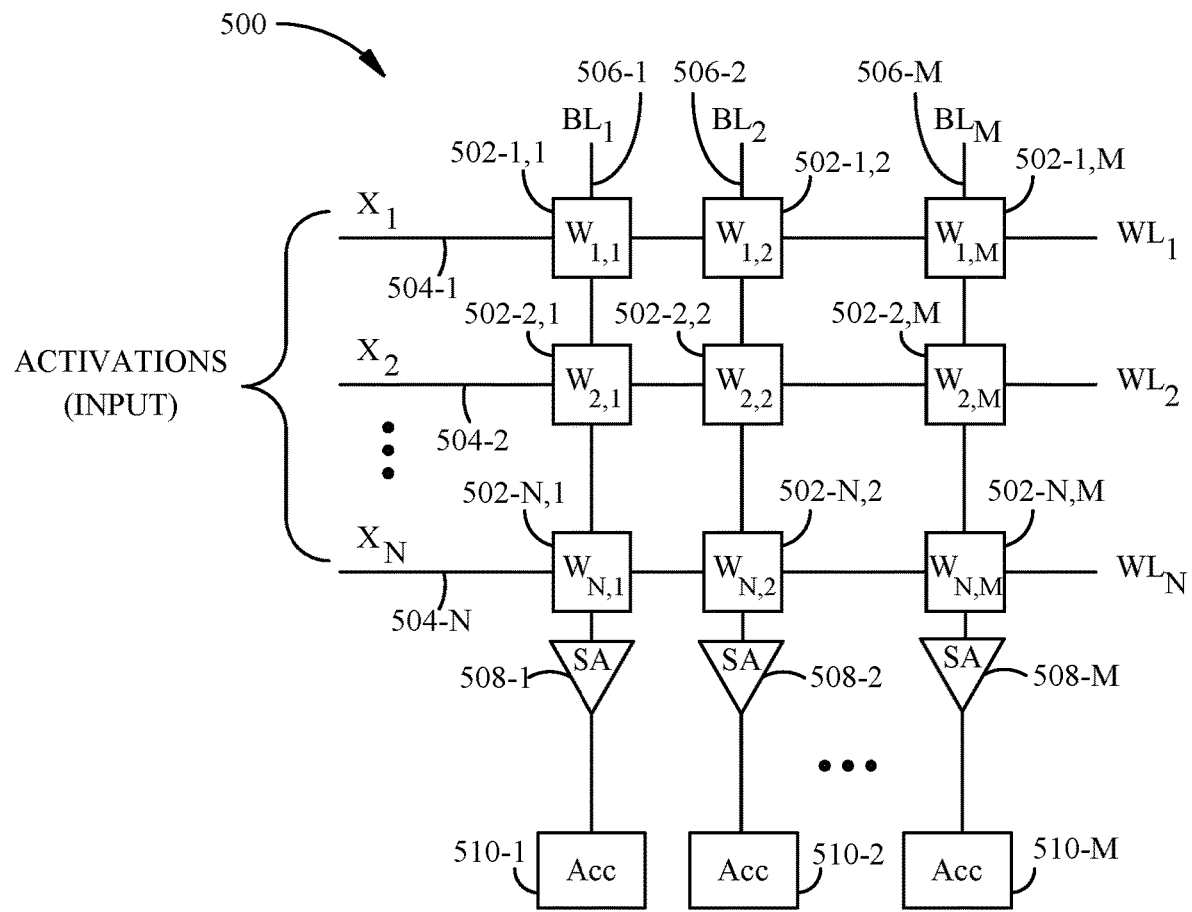
FIG. 5 is a block diagram of an example circuit for digital CIM, in accordance with certain aspects of the present disclosure.

FIG. 5 illustrates a circuit 500 for CIM, in accordance with certain aspects of the present disclosure. The circuit 500 includes a CIM array having N word-lines 504-1 to 504-N (also referred to as rows) and M bit-lines 506-1 to 506-M (also referred to herein as "columns"), N and M each being any integer greater than 1. N and M may be the same or different. Bit-lines 506-1 to 506-M (collectively referred to herein as "BLs 506") are labeled $BL_1$ to $BL_M$ in FIG. 5, and word-lines 504-1 to 504-N (collectively referred to herein as "WLs 504") are labeled $WL_1$ to $WL_N$ in FIG. 5. Each of the BLs 506 may correspond to the RBL in the memory cell 400 of FIG. 4, and each of the WLs 504 may correspond to the RWL in the memory cell 400 of FIG. 4. As shown in FIG. 5, memory cells 502-1,1 to 502-N,M (collectively referred to herein as "memory cells 502") are implemented at the intersections of the WLs 504 and BLs 506. In the memory cell reference scheme (e.g., 502-2,1), the first integer after the dash (here, 2) indicates the word-line, and the second integer after the dash (here, 1) indicates the bit-line, of the intersection where the memory cell is located.

Each of the memory cells 502 may be implemented using the memory cell architecture described with respect to FIG. 4. As shown, activation inputs $X_1$ to $X_N$ may be provided to respective word-lines 504, and the memory cells 502 may store neural network weights $W_1$ to $W_N$, where each weight has M bits (e.g., $W_{1,1}$ to $W_{1,M}$, $W_{2,1}$ to $W_{2,M}$, and $W_{WN,1}$ to $W_{N,M}$). For example, memory cells 502-1,1 to 502-1,M may store M bits for weight $W_1$ (e.g., weight bits $W_{1,1}$ to $W_{1,M}$), memory cells 502-2,1 to 502-2,M may store M bits for weight $W_2$ (e.g., weight bits $W_{2,1}$ to $W_{2,M}$), and so on. The weights may be written to the memory cells 502 via write bit-lines (e.g., WBL 406 and WBLB 420), which are not shown in FIG. 5. During a computation cycle, each memory cell 502 may multiply the received activation bit with the stored weight bit (e.g., may perform a logical NAND operation with the activation bit and the stored weight bit as inputs, as described with respect to FIG. 4).

In some aspects, sense amplifiers (SAs) 508-1 to 508-M (collectively referred to herein as "SAs 508") may be used to sense the signal on a respective one of the bit-lines 506 (e.g., a digital signal from the NAND processing of the memory cell). The SAs 508 may perform concurrent sensing of the bit-lines 506. Each of the sensed signals for a respective BL may be provided to a respective one of accumulators 510-1 to 510-M (collectively referred to herein as "accumulators 510"). The accumulators 510 concurrently perform accumulation of the signals sensed by the SAs 508, on a bit-line basis.

In some aspects, the activation inputs $x_1$ to $x_N$ may be applied one row (word-line) at a time (e.g., one row each computation cycle). For example, the activation input $X_1$ may be provided to word-line 504-1 during a first computation cycle, and the computation (e.g., multiplication, such as a NAND operation as described above) for activation input $W_1$ and weight $W_1$ may be performed via the memory cells on word-line 504-1 storing bit weights $W_{1,1}$ to $W_{1,M}$. The signals (e.g., digital signals) on BLs 506 after the first computation cycle may be sensed (concurrently) via respective SAs 508 and provided to respective accumulators 510. The same operation may be performed for each of activation inputs $X_2$ to $X_N$, one word-line at a time (and in order starting from $X_2$ and ending with $X_N$), during subsequent computation cycles. The accumulators 510 accumulate additional signals on corresponding BLs 506 after each computation cycle. After the computation cycles are complete, each of the accumulators 510 provides an accumulation result for a respective one of the BLs 506. The accumulation result from each accumulator indicates the accumulation of the signals on the respective BL, each of the signals being generated after one of the computation cycles.

Since the word-lines 504 receiving the activation inputs $x_1$ to $x_N$ may be activated one at a time, the number of computation cycles corresponds to the number of activation inputs and is an indication of the amount of time it takes to receive the accumulation results for the activation inputs $x_1$ to $x_N$, as the computation cycles occur sequentially. In some aspects, a computation cycle may be skipped if an activation input associated with the computation cycle is logic low, in effect speeding up the CIM process. In other words, activation inputs $X_1$ to $X_N$ may be provided to respective word-lines during respective computation cycles 1-N. If activation input $X_2$ is logic low, computation cycle 2 may be skipped, reducing the total amount of time it takes for computation by the duration of one computation cycle. Thus, for certain aspects, the computation using memory cells 502-2,1 to 502-2,M may be skipped, and/or the accumulators 510 may skip accumulation of the output signals of memory cells 502-2,1 to 502-2,M based on the activation input $x_2$ being logic low. In this manner, the present disclosure provides a digital CIM array that offers a more accurate multiply-accumulate (MAC) operation as compared to certain implementations using analog CIM.

Example Operations for Digital Computation in Memory (CIM)

Figure 6A:
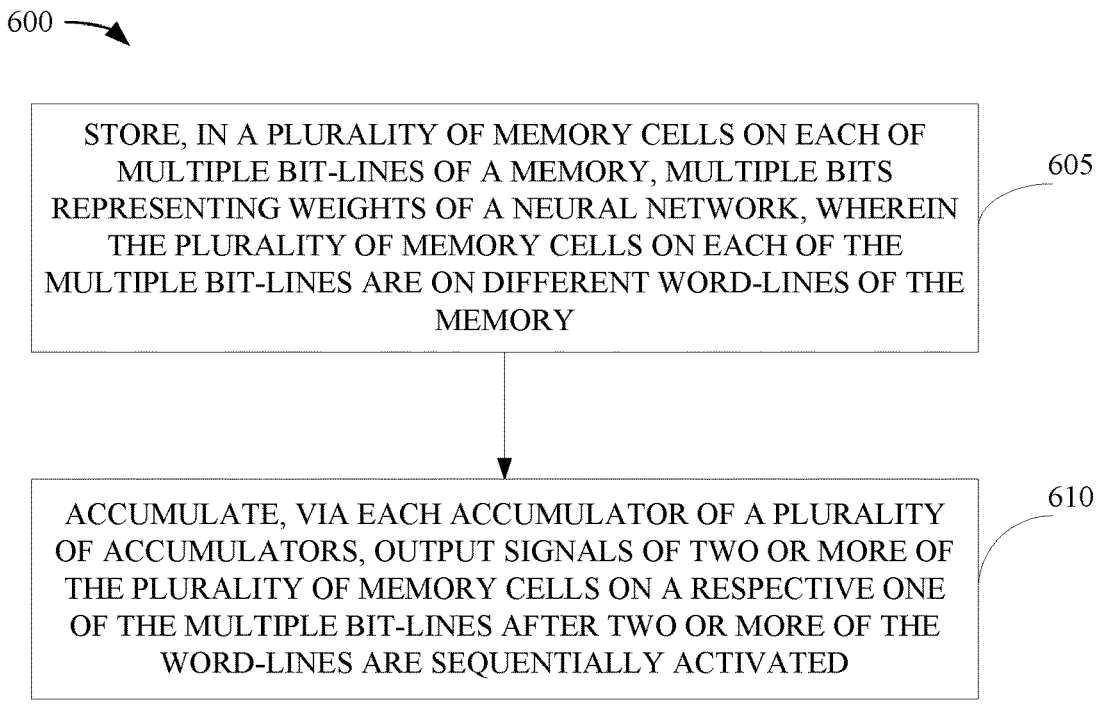
FIGS. 6A and 6B are flow diagrams illustrating example operations for in-memory computation, in accordance with certain aspects of the present disclosure.

FIG. 6A is a flow diagram illustrating example operations 600 for in-memory computation, in accordance with certain aspects of the present disclosure. The operations 600 may be performed by a circuit for CIM (e.g., digital CIM), such as the circuit 500 described with respect to FIG. 5.

The operations 600 begin at block 605 with the circuit storing, in a plurality of memory cells (e.g., memory cells 502) on each of multiple bit-lines (e.g., bit-lines 506) of a memory, multiple bits representing weights of a neural network. For certain aspects, the bits representing weights may be stored using other bit-lines (e.g., write bit-lines, such as WBL 406 and WBLB 420) of the memory. The plurality of memory cells on each of the multiple bit-lines are on different word-lines (e.g., word-lines 504) of the memory, as shown in FIG. 5. In some aspects, the circuit multiplies, via each of the plurality of memory cells, a bit of one of the weights with an activation input provided to a respective one of the word-lines.

At block 610, the circuit accumulates, via each accumulator of a plurality of accumulators (e.g., accumulators 510), output signals of two or more of the plurality of memory cells on a respective one of the multiple bit-lines after two or more of the word-lines are sequentially activated. The output signals may include digital signals generated by the plurality of memory cells on the respective one of the multiple bit-lines (e.g., due to NAND logic of the memory cells). In some aspects, the circuit activates the word-lines of the memory, one word-line at a time. In this case, the activation includes multiplying one of the weights stored in the memory cells on the one word-line with an activation input provided to the one word-line.

In some aspects, the circuit senses, via each sense amplifier of a plurality of sense amplifiers (e.g., SAs 508), the respective one of the multiple bit-lines. The output signals of the plurality of memory cells may be accumulated based on the sensing of the respective one of the multiple bit-lines. In some aspects, the multiple bit-lines are sensed concurrently via the plurality of sense amplifiers, as described herein.

In some aspects, the circuit selects the two or more of the word-lines that are sequentially activated based on an activation input applied to each of the two or more of the word-lines being logic high. For example, the circuit may skip accumulating at least one output signal of at least one other memory cell of the plurality of memory cells based on the at least one other memory cell receiving an activation input that is logic low.

In some aspects, the output signals are accumulated, via a respective one of the plurality of accumulators, after multiple activation cycles. During each of the multiple activation cycles, a respective activation input that is logic high is provided to a respective one of the word-lines.

In some aspects, each of the plurality of memory cells includes a pass-gate transistor (e.g., pass-gate transistor 418), a flip-flop (e.g., comprising the cross-coupled invertor pair 424) coupled to the pass-gate transistor, a first transistor (e.g., transistor 410) having a gate coupled to an output of the flip-flop, and a second transistor (e.g., transistor 412) coupled between the first transistor and the respective one of the multiple bit-lines (e.g., RBL 422 shown in FIG. 4). The first transistor may include a source coupled to a reference potential node (e.g., electric ground) and a drain coupled to a source of the second transistor, a drain of the second transistor being coupled to the respective one of the multiple bit-lines. A gate of the second transistor may be coupled to a respective one of the word-lines (e.g., RWL 408 shown in FIG. 4).

Figure 6B:
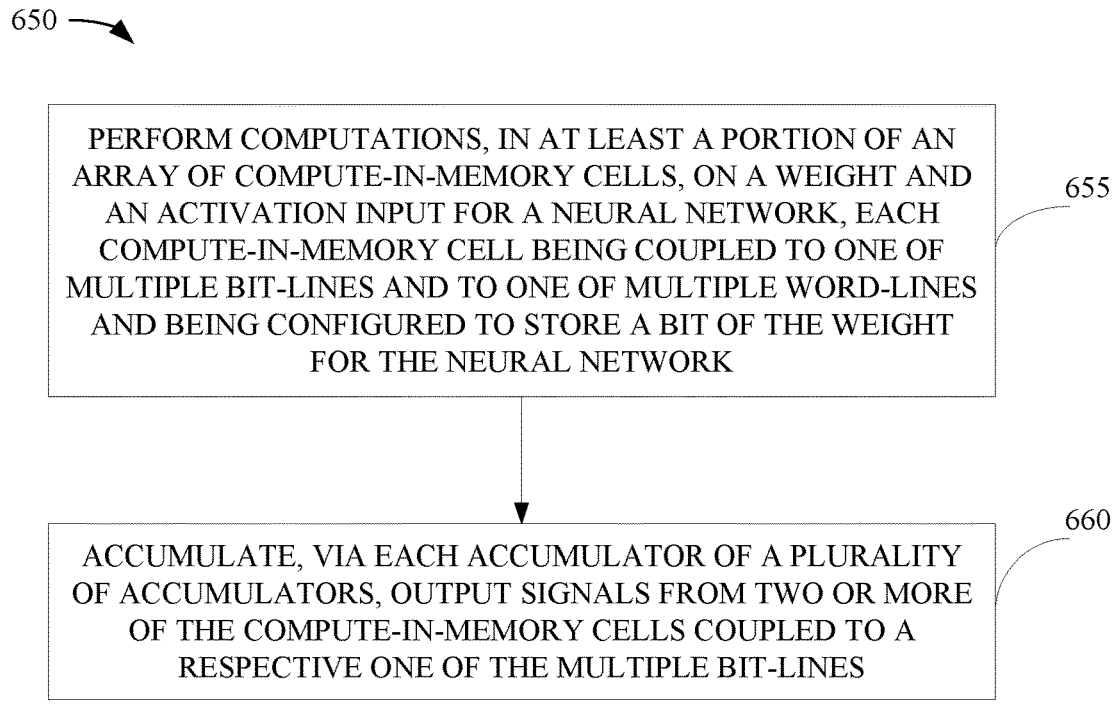

FIG. 6B is a flow diagram illustrating example operations 650 for in-memory computation, in accordance with certain aspects of the present disclosure. The operations 650 may be performed by a circuit for CIM (e.g., digital CIM), such as the circuit 500 described with respect to FIG. 5. Many of the operations 650 may be similar to the operations 600 described above and are not repeated below.

The operations 650 begin at block 655 with the circuit performing computations, in at least a portion of an array of compute-in-memory cells (e.g., memory cells 502), on a weight and an activation input for a neural network. Each compute-in-memory cell may be coupled to one of multiple bit-lines (e.g., bit-lines 506) and to one of multiple word-lines (e.g., word-lines 504) and may be configured to store a bit of the weight for the neural network At block 660, the circuit accumulates, via each accumulator of a plurality of accumulators (e.g., accumulators 510), output signals from two or more of the compute-in-memory cells coupled to a respective one of the multiple bit-lines. The output signals may include digital signals generated by the compute-in-memory cells on the respective one of the multiple bit-lines (e.g., due to NAND logic of the memory cells).

In some aspects, the operations 650 may further include the circuit sequentially activating two or more the word-lines. In this case, the accumulating at block 660 may occur after the sequentially activating. The sequentially activating may involve applying the activation input to each of the two or more word-lines, one word-line at a time.

Example Processing Systems for Computation in Memory (CIM)

Figure 7:
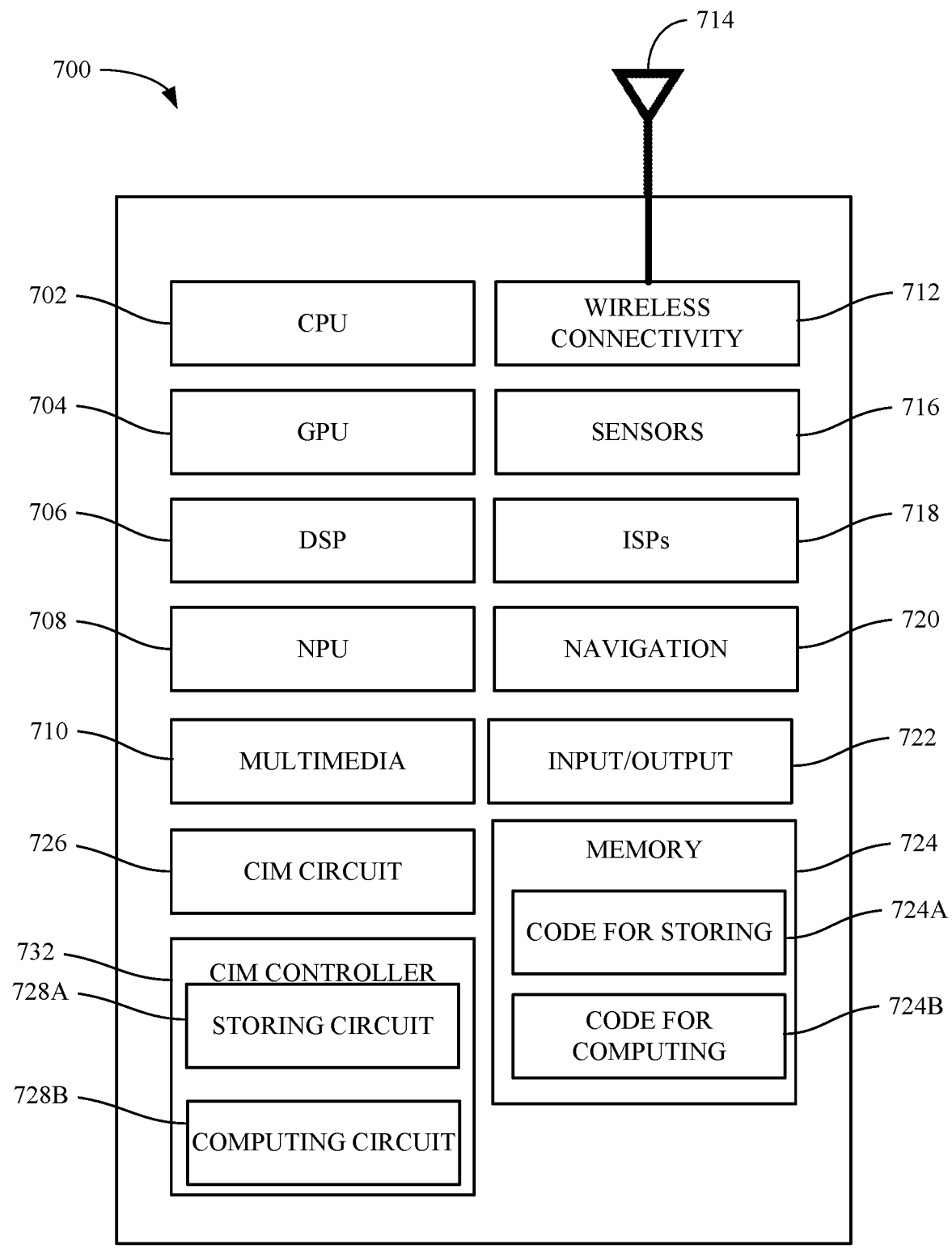
FIG. 7 is a block diagram illustrating an example electronic device having a neural network configured to perform in-memory computation operations, in accordance with certain aspects of the present disclosure.

FIG. 7 illustrates an example electronic device 700. The electronic device 700 may be configured to perform the methods described herein, including the operations 600 and 650 described with respect to FIGS. 6A and 6B.

The electronic device 700 includes a central processing unit (CPU) 702, which in some aspects may be a multi-core CPU. Instructions executed at the CPU 702 may be loaded, for example, from a program memory associated with the CPU 702 or may be loaded from a memory 724.

The electronic device 700 also includes additional processing blocks tailored to specific functions, such as a graphics processing unit (GPU) 704, a digital signal processor (DSP) 706, a neural processing unit (NPU) 708, a multimedia processing block 710, and a wireless connectivity processing block 712. In one implementation, the NPU 708 is implemented in one or more of the CPU 702, GPU 704, and/or DSP 706.

In some aspects, the wireless connectivity processing block 712 may include components, for example, for Third-Generation (3G) connectivity, Fourth-Generation (4G) connectivity (e.g., 4G LTE), Fifth-Generation connectivity (e.g., 5G or NR), Wi-Fi connectivity, Bluetooth connectivity, and/or wireless data transmission standards. The wireless connectivity processing block 712 is further connected to one or more antennas 77 to facilitate wireless communication.

The electronic device 700 may also include one or more sensor processors 716 associated with any manner of sensor, one or more image signal processors (ISPs) 718 associated with any manner of image sensor, and/or a navigation processor 720, which may include satellite-based positioning system components (e.g., GPS or GLONASS) as well as inertial positioning system components.

The electronic device 700 may also include one or more input and/or output devices 722, such as screens, touch-sensitive surfaces (including touch-sensitive displays), physical buttons, speakers, microphones, and the like. In some aspects, one or more of the processors of the electronic device 700 may be based on an ARM instruction set.

The electronic device 700 also includes memory 724, which is representative of one or more static and/or dynamic memories, such as a dynamic random access memory (DRAM), a flash-based static memory, and the like. In this example, memory 724 includes computer-executable components, which may be executed by one or more of the aforementioned processors of the electronic device 700 and/or a CIM controller 732 (also referred to as control circuitry). For certain aspects, the electronic device 700 includes a CIM circuit 726, such as the circuit 500, as described herein. The CIM circuit 726 may be controlled via the CIM controller 732. For instance, in some aspects, memory 724 may include code 724A for storing (e.g., storing weights in memory cells) and code 724B for computing (e.g., performing a neural network computation by applying activation inputs). As illustrated, the CIM controller 732 may include a circuit 728A for storing (e.g., storing weights in memory cells), and a circuit 728B for computing (e.g., performing a neural network computation by applying activation inputs). The depicted components, and others not depicted, may be configured to perform various aspects of the methods described herein.

In some aspects, such as where the electronic device 700 is a server device, various aspects may be omitted from the example depicted in FIG. 7, such as one or more of the multimedia processing block 710, wireless connectivity processing block 712, antenna 714, sensor processors 716, ISPs 718, or navigation processor 720.

Example Clauses

Clause 1. A circuit comprising: multiple bit-lines; multiple word-lines; an array of compute-in-memory cells, wherein each compute-in-memory cell is coupled to one of the bit-lines and to one of the word-lines and is configured to store a weight bit of a neural network; and a plurality of accumulators, each accumulator being coupled to a respective one of the multiple bit-lines.

Clause 2. The circuit of Clause 1, further comprising a plurality of sense amplifiers, each sense amplifier having an output coupled to a respective one of the accumulators and having an input coupled to the respective one of the multiple bit-lines.

Clause 3. The circuit of Clause 2, wherein the plurality of sense amplifiers are configured to concurrently sense the multiple bit-lines.

Clause 4. The circuit of any of Clauses 1-3, wherein the compute-in-memory cells coupled to the multiple bit-lines and to one of the multiple word-lines are configured to perform concurrent computations.

Clause 5. The circuit of any of Clauses 1-4, wherein the multiple word-lines are configured to be activated one word-line at a time.

Clause 6. The circuit of any of Clauses 1-5, wherein: two or more of the word-lines are configured to be sequentially activated; and each of the plurality of accumulators is configured to accumulate output signals from the compute-in-memory cells coupled to the respective one of the multiple bit-lines after the two or more of the word-lines are sequentially activated.

Clause 7. The circuit of Clause 6, wherein the output signals comprise digital signals generated by the compute-in-memory cells on the respective one of the multiple bit-lines.

Clause 8. The circuit of Clause 6 or 7, further comprising control circuitry configured to select the two or more of the word-lines that are sequentially activated based on an activation input applied to each of the two or more of the word-lines being logic high.

Clause 9. The circuit of any of Clauses 1-5, wherein each of the plurality of accumulators is configured to perform accumulation of output signals from the compute-in-memory cells coupled to the respective one of the multiple bit-lines, and wherein, in performing the accumulation, each of the plurality of accumulators is configured to: accumulate output signals from two or more of the compute-in-memory cells; and skip accumulation of at least one output signal from at least one other compute-in-memory cell coupled to the respective one of the multiple bit-lines, based on the at least one other compute-in-memory cell receiving an activation input that is logic low.

Clause 10. The circuit of any of Clauses 1-7, wherein each compute-in-memory cell is configured to multiply the stored weight bit with an activation input provided to a respective one of the multiple word-lines.

Clause 11. The circuit of any of Clauses 1-5, wherein: the compute-in-memory cells coupled to each of the multiple word-lines are configured to be sequentially activated based on a plurality of activation inputs applied to the multiple word-lines; and a respective one of the plurality of accumulators is configured to accumulate output signals from the compute-in-memory cells after the compute-in-memory cells coupled to each of the multiple word-lines are sequentially activated.

Clause 12. The circuit of Clause 11, wherein: the respective one of the plurality of accumulators is configured to accumulate the output signals after multiple activation cycles; and during each of the multiple activation cycles, a respective one of the activation inputs that is logic high is provided to a respective one of the multiple word-lines.

Clause 13. The circuit of any of Clauses 1-12, wherein each compute-in-memory cell comprises: a pass-gate transistor; a cross-coupled invertor pair having an output coupled to the pass-gate transistor; a first transistor having a gate coupled to the output of the cross-coupled invertor pair; and a second transistor coupled between the first transistor and the respective one of the multiple bit-lines.

Clause 14. The circuit of Clause 13, wherein the first transistor comprises a source coupled to a reference potential node and a drain coupled to a source of the second transistor and wherein a drain of the second transistor is coupled to the respective one of the multiple bit-lines.

Clause 15. The circuit of Clause 13 or 14, wherein a gate of the second transistor is coupled to a respective one of the multiple word-lines.

Clause 16. The circuit of any of Clauses 1-15, wherein at least one of the compute-in-memory cells comprises an eight-transistor (8T) static random access memory (SRAM) cell.

Clause 17. A method comprising: performing computations, in at least a portion of an array of compute-in-memory cells, on a weight and an activation input for a neural network, each compute-in-memory cell being coupled to one of multiple bit-lines and to one of multiple word-lines and being configured to store a bit of the weight for the neural network; and accumulating, via each accumulator of a plurality of accumulators, output signals from two or more of the compute-in-memory cells coupled to a respective one of the multiple bit-lines.

Clause 18. The method of Clause 17, further comprising sensing, via each sense amplifier of a plurality of sense amplifiers, the respective one of the multiple bit-lines, wherein the output signals from the two or more of the compute-in-memory cells are accumulated based on the sensing of the respective one of the multiple bit-lines.

Clause 19. The method of Clause 18, wherein the sensing comprises concurrently sensing the multiple bit-lines via the plurality of sense amplifiers.

Clause 20. The method of any of Clauses 17-19, wherein the output signals comprise digital signals generated by the compute-in-memory cells on the respective one of the multiple bit-lines.

Clause 21. The method of any of Clauses 17-20, further comprising sequentially activating two or more the word-lines, wherein the accumulating occurs after the sequentially activating and wherein the sequentially activating comprises applying the activation input to each of the two or more word-lines, one word-line at a time.

Clause 22. The method of Clause 21, further comprising selecting the two or more of the word-lines that are sequentially activated based on the activation input applied to each of the two or more of the word-lines being logic high.

Clause 23. The method of any of Clauses 17-22, further comprising skipping accumulating of at least one output signal from at least one other compute-in-memory cell in the array of compute-in-memory cells based on the at least one other compute-in-memory cell receiving the activation input, which is logic low.

Clause 24. The method of any of Clauses 17-23, wherein performing the computations comprises multiplying, via each of the compute-in-memory cells coupled to a respective one of the multiple word-lines in the at least the portion of the array, the bits of the weight with the activation input provided to the respective one of the multiple word-lines.

Clause 25. The method of any of Clauses 17-24, wherein: the output signals are accumulated, via a respective one of the plurality of accumulators, after multiple activation cycles; and during each of the multiple activation cycles, a respective activation input that is logic high is provided to a respective one of the multiple word-lines.

Clause 26. The method of any of Clauses 17-25, wherein each compute-in-memory cell comprises: a pass-gate transistor; a flip-flop having an input coupled to the pass-gate transistor; a first transistor having a gate coupled to an output of the flip-flop; and a second transistor coupled between the first transistor and the respective one of the multiple bit-lines.

Clause 27. The method of Clause 26, wherein the first transistor comprises a source coupled to a reference potential node and a drain coupled to a source of the second transistor and wherein a drain of the second transistor is coupled to the respective one of the multiple bit-lines.

Clause 28. The method of Clause 26 or 27, wherein a gate of the second transistor is coupled to a respective one of the multiple word-lines.

Clause 29. A circuit for in-memory computation, comprising: a plurality of memory cells on each of multiple bit-lines of a memory, the plurality of memory cells being configured to store multiple bits representing weights of a neural network, wherein the plurality of memory cells on each of the multiple bit-lines are on different word-lines of the memory; and a plurality of accumulators, each accumulator being coupled to a respective one of the multiple bit-lines.

Clause 30. The circuit of Clause 29, further comprising a plurality of sense amplifiers, each sense amplifier having an output coupled to a respective accumulator and having an input coupled to the respective one of the multiple bit-lines.

Clause 31. The circuit of Clause 30, wherein the plurality of sense amplifiers are configured to concurrently sense the multiple bit-lines.

Clause 32. The circuit of any of Clauses 29-31, wherein the memory cells on the multiple bit-lines and on one of the word-lines are configured to perform concurrent computations.

Clause 33. The circuit of any of Clauses 29-32, wherein the word-lines of the memory are configured to be activated one word-line at a time.

Clause 34. The circuit of any of Clauses 29-33, wherein: two or more of the word-lines are configured to be sequentially activated; and each of the plurality of accumulators is configured to accumulate output signals of the plurality of memory cells on the respective one of the multiple bit-lines after the two or more of the word-lines are sequentially activated.

Clause 35. The circuit of Clause 34, wherein the output signals comprise digital signals generated by the plurality of memory cells on the respective one of the multiple bit-lines.

Clause 36. The circuit of Clause 34 or 35, further comprising control circuitry configured to select the two or more of the word-lines that are sequentially activated based on an activation input applied to each of the two or more word-lines being logic high.

Clause 37. The circuit of any of Clauses 29-36, wherein each of the plurality of accumulators is configured to perform accumulation of memory cell output signals for the respective one of the multiple bit-lines, and wherein, in performing the accumulation, each of the plurality of accumulators is configured to: accumulate output signals of two or more of the plurality of memory cells; and skip accumulating of at least one output signal of at least one other memory cell of the plurality of memory cells based on the at least one other memory cell receiving an activation input that is logic low.

Clause 38. The circuit of any of Clauses 29-37, wherein each of the plurality of memory cells is configured to multiply a bit of one of the weights with an activation input provided to a respective one of the word-lines.

Clause 39. The circuit of any of Clauses 29-38, wherein: the plurality of memory cells are configured to be sequentially activated based on a plurality of activation inputs applied to the word-lines; and a respective one of the plurality of accumulators is configured to accumulate output signals from the plurality of memory cells after the plurality of memory cells are sequentially activated.

Clause 40. The circuit of Clause 39, wherein: the respective one of the plurality of accumulators is configured to accumulate the output signals after multiple activation cycles; and during each of the multiple activation cycles, a respective one of the activation inputs that is logic high is provided to a respective one of the word-lines.

Clause 41. The circuit of any of Clauses 29-40, wherein each of the plurality of memory cells comprises: a pass-gate transistor; a cross-coupled invertor pair having an output coupled to the pass-gate transistor; a first transistor having a gate coupled to the output of the cross-coupled invertor pair; and a second transistor coupled between the first transistor and the respective one of the multiple bit-lines.

Clause 42. The circuit of Clause 41, wherein the first transistor comprises a source coupled to a reference potential node and a drain coupled to a source of the second transistor and wherein a drain of the second transistor is coupled to the respective one of the multiple bit-lines.

Clause 43. The circuit of Clause 41 or 42, wherein a gate of the second transistor is coupled to a respective one of the word-lines.

Clause 44. The circuit of any of Clauses 29-43, wherein at least one of the memory cells comprises an eight-transistor (8T) static random access memory (SRAM) cell.

Clause 45. A method for in-memory computation, comprising: storing, in a plurality of memory cells on each of multiple bit-lines of a memory, multiple bits representing weights of a neural network, wherein the plurality of memory cells on each of the multiple bit-lines are on different word-lines of the memory; and accumulating, via each accumulator of a plurality of accumulators, output signals of two or more of the plurality of memory cells on a respective one of the multiple bit-lines after two or more of the word-lines are sequentially activated.

Clause 46. The method of Clause 45, further comprising sensing, via each sense amplifier of a plurality of sense amplifiers, the respective one of the multiple bit-lines, wherein the output signals of the plurality of memory cells are accumulated based on the sensing of the respective one of the multiple bit-lines.

Clause 47. The method of Clause 46, wherein the multiple bit-lines are sensed concurrently via the plurality of sense amplifiers.

Clause 48. The method of any of Clauses 45-47, further comprising activating the word-lines of the memory, one word-line at a time, wherein the activating comprises multiplying one of the weights stored in the memory cells on the one word-line with an activation input provided to the one word-line.

Clause 49. The method of any of Clauses 45-48, wherein the output signals comprise digital signals generated by the plurality of memory cells on the respective one of the multiple bit-lines.

Clause 50. The method of any of Clauses 45-49, further comprising selecting the two or more of the word-lines that are sequentially activated based on an activation input applied to each of the two or more of the word-lines being logic high.

Clause 51. The method of any of Clauses 45-50, further comprising skipping accumulating of at least one output signal of at least one other memory cell of the plurality of memory cells based on the at least one other memory cell receiving an activation input that is logic low.

Clause 52. The method of any of Clauses 45-51, further comprising multiplying, via each of the plurality of memory cells, a bit of one of the weights with an activation input provided to a respective one of the word-lines.

Clause 53. The method of any of Clauses 45-52, wherein: the output signals are accumulated, via a respective one of the plurality of accumulators, after multiple activation cycles; and during each of the multiple activation cycles, a respective activation input that is logic high is provided to a respective one of the word-lines.

Clause 54. The method of any of Clauses 45-53, wherein each of the plurality of memory cells comprises: a pass-gate transistor; a flip-flop having an input coupled to the pass-gate transistor; a first transistor having a gate coupled to an output of the flip-flop; and a second transistor coupled between the first transistor and the respective one of the multiple bit-lines.

Clause 55. The method of Clause 54, wherein the first transistor comprises a source coupled to a reference potential node and a drain coupled to a source of the second transistor and wherein a drain of the second transistor is coupled to the respective one of the multiple bit-lines.

Clause 56. The method of Clause 54 or 55, wherein a gate of the second transistor is coupled to a respective one of the word-lines.

Clause 57. An apparatus for in-memory computation, comprising: means for storing, in a plurality of memory cells on each of multiple bit-lines of the means for storing, multiple bits representing weights of a neural network, wherein the plurality of memory cells on each of the multiple bit-lines are on different word-lines of the means for storing; and means for accumulating output signals of two or more of the plurality of memory cells on a respective one of the multiple bit-lines after two or more of the word-lines are sequentially activated.

Clause 58. The apparatus of Clause 57, further comprising means for sensing the respective one of the multiple bit-lines, wherein the output signals of the plurality of memory cells are accumulated based on the sensing of the respective one of the multiple bit-lines.

ADDITIONAL CONSIDERATIONS

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the generic principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering. For example, means for storing may include: (1) a CIM array, such as the array of memory cells 502, or (2) a CIM controller, such as the CIM controller 732 including a circuit 728A for storing, and memory such as memory 724 including code 724A for storing. Means for accumulating may include an accumulator such as the accumulators 510. Means for sensing may include a sense amplifier (SA), such as the SAs 508.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A circuit comprising:
   multiple bit-lines;
   multiple word-lines;
   an array of compute-in-memory cells, wherein each compute-in-memory cell is coupled to one of the bit-lines and to one of the word-lines and is configured to store a weight bit of a neural network;
   a plurality of accumulators, each accumulator being coupled to a respective one of the multiple bit-lines; and
   a plurality of sense amplifiers, each sense amplifier having an output coupled to a respective one of the accumulators and having an input coupled to the respective one of the multiple bit-lines,
   wherein the plurality of sense amplifiers are configured to concurrently sense the multiple bit-lines on a bit-line basis,
   wherein the multiple word-lines are configured to be activated one word-line at a time for each computational cycle, and
   wherein the number of computation cycles corresponds to the number of activation inputs and is an indication of the amount of time it takes to receive accumulation results for the activation inputs.

2. The circuit of claim 1, wherein the compute-in-memory cells coupled to the multiple bit-lines and to one of the multiple word-lines are configured to perform concurrent computations.

3. The circuit of claim 1, wherein:
   two or more of the word-lines are configured to be sequentially activated; and
   each of the plurality of accumulators is configured to accumulate output signals from the compute-in-memory cells coupled to the respective one of the multiple bit-lines after the two or more of the word-lines are sequentially activated.

4. The circuit of claim 3, wherein the output signals comprise digital signals generated by the compute-in-memory cells on the respective one of the multiple bit-lines.

5. The circuit of claim 3, further comprising control circuitry configured to select the two or more of the word-lines that are sequentially activated based on an activation input applied to each of the two or more of the word-lines being logic high.

6. The circuit of claim 1, wherein each of the plurality of accumulators is configured to perform accumulation of output signals from the compute-in-memory cells coupled to the respective one of the multiple bit-lines, and wherein, in performing the accumulation, each of the plurality of accumulators is configured to:
   accumulate output signals from two or more of the compute-in-memory cells; and
   skip accumulation of at least one output signal from at least one other compute-in-memory cell coupled to the respective one of the multiple bit-lines, based on the at least one other compute-in-memory cell receiving an activation input that is logic low.

7. The circuit of claim 1, wherein each compute-in-memory cell is configured to multiply the stored weight bit with an activation input provided to a respective one of the multiple word-lines.

8. The circuit of claim 1, wherein:
   the compute-in-memory cells coupled to each of the multiple word-lines are configured to be sequentially activated based on a plurality of activation inputs applied to the multiple word-lines; and
   a respective one of the plurality of accumulators is configured to accumulate output signals from the compute-in-memory cells after the compute-in-memory cells coupled to each of the multiple word-lines are sequentially activated.

9. The circuit of claim 8, wherein:
   the respective one of the plurality of accumulators is configured to accumulate the output signals after multiple activation cycles; and
   during each of the multiple activation cycles, a respective one of the activation inputs that is logic high is provided to a respective one of the multiple word-lines.

10. The circuit of claim 1, wherein each compute-in-memory cell comprises:
    a pass-gate transistor;
    a cross-coupled invertor pair having an output coupled to the pass-gate transistor;
    a first transistor having a gate coupled to the output of the cross-coupled invertor pair; and
    a second transistor coupled between the first transistor and the respective one of the multiple bit-lines.

11. The circuit of claim 10, wherein the first transistor comprises a source coupled to a reference potential node and a drain coupled to a source of the second transistor and wherein a drain of the second transistor is coupled to the respective one of the multiple bit-lines.

12. The circuit of claim 10, wherein a gate of the second transistor is coupled to a respective one of the multiple word-lines.

13. The circuit of claim 1, wherein at least one of the compute-in-memory cells comprises an eight-transistor (8T) static random access memory (SRAM) cell.

14. A method comprising:
    performing computations, in at least a portion of an array of compute-in-memory cells, on a weight and an activation input for a neural network, each compute-in-memory cell being coupled to one of multiple bit-lines and to one of multiple word-lines and being configured to store a bit of the weight for the neural network;
    accumulating, via each accumulator of a plurality of accumulators, output signals from two or more of the compute-in-memory cells coupled to a respective one of the multiple bit-lines;
    sensing, via each sense amplifier of a plurality of sense amplifiers, the respective one of the multiple bit-lines, wherein the output signals from the two or more of the compute-in-memory cells are accumulated based on the sensing of the respective one of the multiple bit-lines; and sequentially activating two or more of the word-lines, wherein the accumulating occurs after the sequentially activating and wherein the sequentially activating comprises applying the activation input to each of the two or more word-lines, one word-line at a time for each computational cycle, wherein the sensing comprises concurrently sensing the multiple bit-lines via the plurality of sense amplifiers on a bit-line basis, and wherein the number of computation cycles corresponds to the number of activation inputs and is an indication of the amount of time it takes to receive accumulation results for the activation inputs.

15. The method of claim 14, wherein the output signals comprise digital signals generated by the compute-in-memory cells on the respective one of the multiple bit-lines.

16. The method of claim 14, further comprising sequentially activating two or more of the word-lines, wherein the accumulating occurs after the sequentially activating and wherein the sequentially activating comprises applying the activation input to each of the two or more word-lines, one word-line at a time.

17. The method of claim 16, further comprising selecting the two or more word-lines that are sequentially activated based on the activation input applied to each of the two or more word-lines being logic high.

18. The method of claim 14, further comprising skipping accumulating of at least one output signal from at least one other compute-in-memory cell in the array of compute-in-memory cells based on the at least one other compute-in-memory cell receiving the activation input, which is logic low.

19. The method of claim 14, wherein performing the computations comprises multiplying, via each of the compute-in-memory cells coupled to a respective one of the multiple word-lines in the at least the portion of the array, the bits of the weight with the activation input provided to the respective one of the multiple word-lines.

20. The method of claim 14, wherein:
the output signals are accumulated, via a respective one of the plurality of accumulators, after multiple activation cycles; and
during each of the multiple activation cycles, a respective activation input that is logic high is provided to a respective one of the multiple word-lines.

21. The method of claim 14, wherein each compute-in-memory cell comprises:
a pass-gate transistor;
a flip-flop having an input coupled to the pass-gate transistor;
a first transistor having a gate coupled to an output of the flip-flop; and
a second transistor coupled between the first transistor and the respective one of the multiple bit-lines.

22. The method of claim 21, wherein the first transistor comprises a source coupled to a reference potential node and a drain coupled to a source of the second transistor and wherein a drain of the second transistor is coupled to the respective one of the multiple bit-lines.

23. The method of claim 21, wherein a gate of the second transistor is coupled to a respective one of the multiple word-lines.

* * * * *